US012648461B2

(12) United States Patent
Jeong

(10) Patent No.: US 12,648,461 B2
(45) Date of Patent: Jun. 2, 2026

(54) SEMICONDUCTOR PACKAGES HAVING UPPER CONDUCTIVE PATTERNS

(71) Applicant: Samsung Electronics Co., Ltd., Suwon-si (KR)

(72) Inventor: Kwangok Jeong, Gwangmyeong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 562 days.

(21) Appl. No.: 17/979,233

(22) Filed: Nov. 2, 2022

(65) Prior Publication Data

US 2023/0142267 A1     May 11, 2023

(30) Foreign Application Priority Data

Nov. 10, 2021     (KR) ........................ 10-2021-0154011

(51) Int. Cl.
| | |
|---|---|
| *H10W 70/60* | (2026.01) |
| *H10W 70/09* | (2026.01) |
| *H10W 74/10* | (2026.01) |
| *H10W 90/00* | (2026.01) |
| *H10W 70/65* | (2026.01) |

(52) U.S. Cl.
CPC ......... *H10W 70/614* (2026.01); *H10W 70/09* (2026.01); *H10W 70/60* (2026.01); *H10W 74/117* (2026.01); *H10W 90/701* (2026.01); *H10W 70/65* (2026.01)

(58) Field of Classification Search
CPC ............. H01L 23/5389; H01L 23/3128; H01L 23/49816; H01L 24/19; H01L 24/20; H01L 2224/02373
See application file for complete search history.

(56) References Cited

U.S. PATENT DOCUMENTS

| | | | |
|---|---|---|---|
| 8,619,431 | B2 | 12/2013 | Lin et al. |
| 9,312,198 | B2 | 4/2016 | Meyer et al. |
| 9,929,100 | B2 | 3/2018 | Lee et al. |
| 10,490,540 | B2 | 11/2019 | Yu et al. |
| 10,566,289 | B2 | 2/2020 | Lee et al. |
| 10,672,738 | B2 | 6/2020 | Yu et al. |
| 2008/0116564 | A1 | 5/2008 | Yang et al. |
| 2013/0277851 | A1* | 10/2013 | Lin ..................... H01L 23/3128 257/773 |
| 2017/0103951 | A1* | 4/2017 | Lee ..................... H01L 21/4857 |

(Continued)

*Primary Examiner* — Jacob Y Choi
*Assistant Examiner* — Neil R Prasad
(74) *Attorney, Agent, or Firm* — Muir Patent Law, PLLC

(57)     ABSTRACT

A semiconductor package includes a lower redistribution structure including a wiring layer, and a via connected to the wiring layer, a connection substrate on the lower redistribution structure, the connection substrate including a base layer, lower conductive patterns in the base layer, first upper conductive patterns disposed on the base layer, the first upper conductive patterns including an upper pad, and a second upper conductive pattern disposed on the upper pad, a semiconductor chip disposed on the lower redistribution structure and disposed in a cavity of the connection substrate, an encapsulant covering the lower redistribution structure, the connection substrate and the semiconductor chip, and an upper redistribution structure on the encapsulant. The upper redistribution structure includes a redistribution via connected to the second upper conductive pattern.

17 Claims, 11 Drawing Sheets

100

(56) References Cited

U.S. PATENT DOCUMENTS

| 2018/0082933 | A1* | 3/2018 | Ko | .......................... | H01L 21/568 |
| 2021/0020608 | A1* | 1/2021 | Kim | ...................... | H01L 23/544 |
| 2021/0233859 | A1 | 7/2021 | Lee et al. | | |
| 2021/0398905 | A1* | 12/2021 | Teng | ................... | H01L 25/0652 |

* cited by examiner

100

SEMICONDUCTOR PACKAGES HAVING UPPER CONDUCTIVE PATTERNS

CROSS-REFERENCE TO THE RELATED APPLICATION

This application claims the benefit of priority under 35 U.S.C. § 119 to Korean Patent Application No. 10-2021-0154011, filed on Nov. 10, 2021, in the Korean Intellectual Property Office, the disclosure of which is incorporated herein by reference in its entirety.

BACKGROUND

1. Field

The exemplary embodiments of the disclosure relate to a semiconductor package having an upper conductive pattern.

2. Description of the Related Art

In accordance with advances in electronics industries, semiconductor packages are being required to achieve miniaturization, light weight, and a reduction in manufacturing costs. In accordance with high integration of a semiconductor chip, the size of the semiconductor chip is further reduced. As the semiconductor chip is reduced in size, a fan-out panel-level package has been proposed in order to diversify a board on which the semiconductor chip is mounted.

SUMMARY

The exemplary embodiments of the disclosure provide a semiconductor package capable of having a reduced size.

A semiconductor package according to exemplary embodiments of the disclosure may include a lower redistribution structure including a wiring layer, and a via connected to the wiring layer, a connection substrate on the lower redistribution structure, the connection substrate including a base layer, lower conductive patterns in the base layer, first upper conductive patterns disposed on the base layer, the first upper conductive patterns including an upper pad, and a second upper conductive pattern disposed on the upper pad, a semiconductor chip disposed on the lower redistribution structure and disposed in a cavity of the connection substrate, an encapsulant covering the lower redistribution structure, the connection substrate and the semiconductor chip, and an upper redistribution structure on the encapsulant. The upper redistribution structure may include a redistribution via connected to the second upper conductive pattern.

A semiconductor package according to exemplary embodiments of the disclosure may include a lower package, and an upper package on the lower package. The lower package may include a lower redistribution structure including a wiring layer, and a via connected to the wiring layer, a connection substrate on the lower redistribution structure, the connection substrate including a base layer, lower conductive patterns in the base layer, first upper conductive patterns disposed on the base layer, the first upper conductive patterns including an upper pad, and a second upper conductive pattern disposed on the upper pad, a first semiconductor chip disposed on the lower redistribution structure and disposed in a cavity of the connection substrate, an encapsulant covering the lower redistribution structure, the connection substrate and the semiconductor chip, and an upper redistribution structure on the encapsulant. The upper redistribution structure may include a redistribution via connected to the second upper conductive pattern.

A semiconductor package according to exemplary embodiments of the disclosure may include a lower redistribution structure including a wiring layer, and a via connected to the wiring layer, an outer connection terminal below the lower redistribution structure, a connection substrate on the lower redistribution structure, the connection substrate including base layers, lower conductive patterns in the base layers, first upper conductive patterns disposed on an uppermost one of the base layers, the first upper conductive patterns including an upper pad, and a second upper conductive pattern disposed on the upper pad, a semiconductor chip disposed on the lower redistribution structure and disposed in a cavity of the connection substrate, an encapsulant covering the lower redistribution structure, the connection substrate and the semiconductor chip, and an upper redistribution structure on the encapsulant. The upper redistribution structure may include an insulating layer covering an upper surface of the encapsulant, a wiring layer on the insulating layer, and a redistribution via interconnecting the wiring layer and the second upper conductive pattern.

DETAILED DESCRIPTION OF EXEMPLARY EMBODIMENTS

Figure 1:
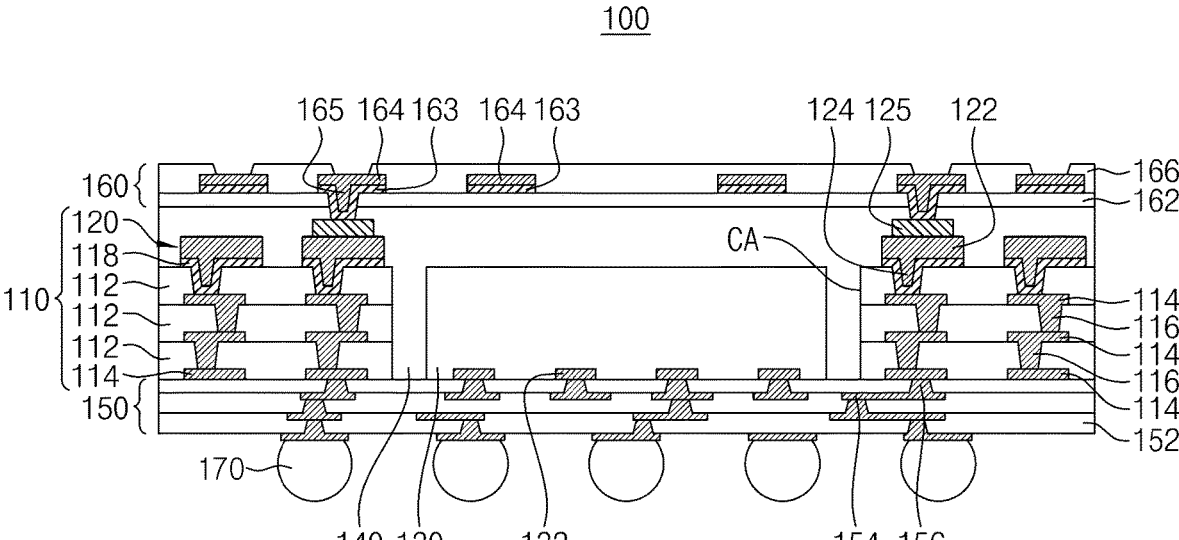
FIG. 1 is a vertical sectional view of a semiconductor package according to an exemplary embodiment of the inventive concepts.
Figure 2:
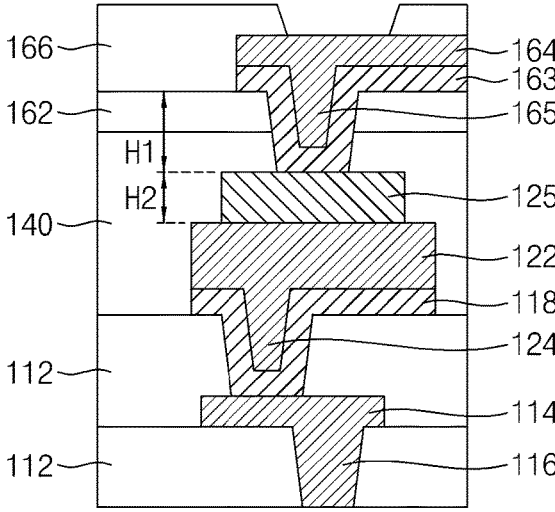
FIG. 2 is an enlarged view of the semiconductor package shown in FIG. 1.

FIG. 1 is a vertical sectional view of a semiconductor package according to an exemplary embodiment of the inventive concepts. FIG. 2 is an enlarged view of the semiconductor package shown in FIG. 1.

Referring to FIG. 1, a semiconductor package 100 may include a connection substrate 110, a semiconductor chip 130, an encapsulant 140, a lower redistribution structure 150, an upper redistribution structure 160, and an outer connection terminal 170. Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

The connection substrate 110 may be disposed on the lower redistribution structure 150, and may include a cavity CA therein. For example, the connection substrate 110 may extend in a horizontal direction while surrounding the cavity CA, and may have a quadrangular shape or a frame shape. The connection substrate 110 may also include a base layer 112, a conductive pattern 114, a connection via 116, a first seed layer 118, a first upper conductive pattern 120, an upper via 124, and a second upper conductive pattern 125. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim).

Base layers 112 may constitute a plurality of layers, and a lowermost one of the base layers 112 may contact the lower redistribution structure 150. Lower conductive patterns 114 may extend among the base layers 112 in the horizontal direction. For example, the lower conductive patterns 114 may be disposed at a lower surface of the connection substrate 110 or among the base layers 112. Connection vias 116 may extend in a vertical direction in order to interconnect the lower conductive patterns 114 disposed at different layers. The lower conductive patterns 114 of the plurality of layers and the connection vias 116 interconnecting the lower conductive patterns 114 may constitute a wiring structure. A lowermost one of the lower conductive patterns 114 may be electrically connected to the lower redistribution structure 150.

The first upper conductive pattern 120 may be disposed over an uppermost one of the lower conductive patterns 114. A portion of the first upper conductive pattern 120 may be disposed in the base layer 112, and a remaining portion of the first upper conductive pattern 120 may be disposed on an upper surface of an uppermost one of the base layers 112. From among the first upper conductive patterns 120, the first upper conductive pattern 120 contacting the second upper conductive pattern 125 may be referred to as an upper pad 122. A portion of the first upper conductive pattern 120 extending in the vertical direction while extending through the base layer 112 may be referred to as an upper via 124.

Further referring to FIG. 2, the upper pad 122 may extend in the horizontal direction at an upper surface of the base layer 112, and may contact the upper via 124. For example, the upper pad 122 and the upper via 124 may be integrally formed. The first seed layer 118 may be disposed along a lower surface of the first upper conductive pattern 120. For example, the first seed layer 118 may be disposed between the upper surface of the base layer 112 and the first upper conductive pattern 120, and may cover a lower surface of the upper pad 122 and a lower surface and side surfaces of the upper via 124. The first seed layer 118 may contact an upper surface of the lower conductive pattern 114. Although not shown, seed layers may also be disposed at lower surfaces of the lower conductive pattern 114 and the connection via 116.

The second upper conductive pattern 125 may be disposed on the upper pad 122. As shown in FIG. 1, the second upper conductive pattern 125 may be disposed at an upper surface of a part of the first upper conductive patterns 120. As described above, the first upper conductive pattern 120 contacting the second upper conductive pattern 125 from among the first upper conductive patterns 120 may be referred to as the upper pad 122. In an embodiment, a height H2 of the second upper conductive pattern 125 may be 15 to 20 μm.

Figure 3:
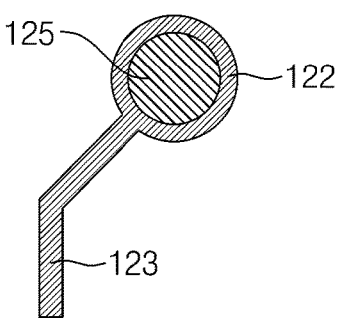
FIG. 3 is a plan view showing upper conductive patterns of the semiconductor package shown in FIG. 1.

FIG. 3 is a plan view showing the upper conductive patterns of the semiconductor package shown in FIG. 1.

Further referring to FIG. 3, the first upper conductive pattern 120 may include the upper pad 122 and an upper wiring 123. The upper wiring 123 may refer to a portion of the first upper conductive pattern 120 connected to the upper pad 122 while having a smaller horizontal width than the upper pad 122. The upper wiring 123 may extend in the horizontal direction on the upper surface of the uppermost base layer 112. The second upper conductive pattern 125 may not be disposed on the upper wiring 123, and an upper surface of the upper wiring 123 may be completely covered by the encapsulant 140. In an embodiment, the horizontal width of the second upper conductive pattern 125 may be smaller than the horizontal width of the upper pad 122. An upper surface of the upper pad 122 may partially contact the encapsulant 140. Although the upper pad 122 and the second upper conductive pattern 125 are shown as having a circular shape, the exemplary embodiments of the disclosure are not limited thereto. In some embodiments, the upper pad 122 and the second upper conductive pattern 125 may have a shape such as a quadrangular shape or an oval shape.

Again referring to FIG. 1, the semiconductor chip 130 may be mounted on the lower redistribution structure 150, and may be spaced apart from the connection substrate 110. The semiconductor chip 130 may include chip pads 132 at a lower surface thereof, and the chip pads 132 may be electrically connected to the lower redistribution structure 150.

The encapsulant 140 may be disposed between the lower redistribution structure 150 and the upper redistribution structure 160. The encapsulant 140 may cover the lower redistribution structure 150, the connection substrate 110, and the semiconductor chip 130. The encapsulant 140 may also fill the cavity CA, and may fill, for example, a space between the semiconductor chip 130 and the connection substrate 110.

The lower redistribution structure 150 may include an insulating layer 152, a wiring layer 154, and a via 156. Insulating layers 152 may constitute a plurality of layers, and an uppermost one of the insulating layers 152 may contact the connection substrate 110, the semiconductor chip 130, and the encapsulant 140. Wiring layers 154 may extend in the horizontal direction among the insulating layers 152, and vias 156 may extend in the vertical direction in order to interconnect the wiring layers 154 which are disposed at different layers. The chip pad 132 and the lowermost conductive pattern 114 may be connected to the vias 156, respectively. The lower redistribution structure 150 may be electrically connected to the connection substrate 110 and the semiconductor chip 130.

The upper redistribution structure 160 may be disposed at an upper surface of the encapsulant 140. The upper redistribution structure 160 may include an insulating layer 162, a second seed layer 163, a wiring layer 164, a redistribution via 165, and a protective layer 166. The insulating layer 162 may cover the upper surface of the encapsulant 140, and the wiring layer 164 may extend in the horizontal direction at an upper surface of the insulating layer 162. The redistribution via 165 may extend in the vertical direction while extending through the insulating layer 162 and the encapsulant 140, and may be electrically connected to the second upper conductive pattern 125. The redistribution via 165 may be connected to a part of wiring layers 164, and, for example, may be formed integrally with the part of wiring layers 164. In an embodiment, a height H1 between the upper surface of the insulating layer 162 and an upper surface of the second upper conductive pattern 125 may be 25 to 35 The second seed layer 163 may be disposed along a lower surface of the wiring layer 164. For example, the second seed layer 163 may be disposed between the upper surface of the insulating layer 162 and the wiring layer 164. The second seed layer 163 may also cover the lower surface of the wiring layer 164 and a lower surface and side surfaces of the redistribution via 165, and may contact the upper surface of the second upper conductive pattern 125. The protective layer 166 may cover the insulating layer 162, the second seed layer 163, and the wiring layer 164, and may partially expose the upper surface of at least one of the wiring layers 164.

The outer connection terminal 170 may be disposed at a lower surface of the lower redistribution structure 150. The outer connection terminal 170 may be connected to the wiring layer 154 of the lower redistribution structure 150. The outer connection terminal 170 may also be electrically connected to the connection substrate 110 or the semiconductor chip 130 via the lower redistribution structure 150.

As shown in FIG. 1, the connection substrate 110 may include the second upper conductive pattern 125 disposed on the upper pad 122. Since the second upper conductive pattern 125 is disposed on the upper pad 122, it may be possible to reduce the height of the redistribution via 165 by the height of the second upper conductive pattern 125. Accordingly, it may be unnecessary to form a deeper hole at the encapsulant 140 in order to form the redistribution via 165 and, as such, it may be possible to reduce the size of the redistribution via 165 and the size of the semiconductor package 100.

FIGS. 4 to 19 are vertical sectional views illustrating a method of manufacturing a semiconductor package according to an exemplary embodiment of the inventive concepts.

Figure 4:
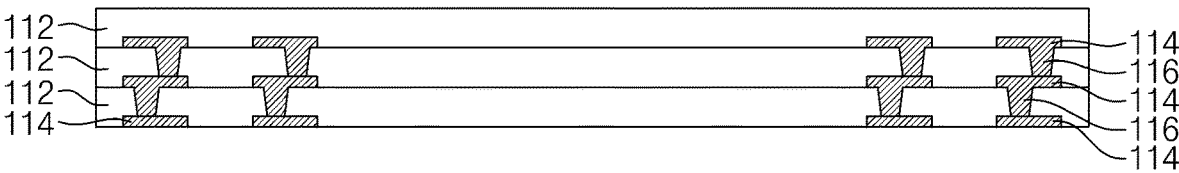
FIGS. 4 to 19 are vertical sectional views illustrating a method of manufacturing a semiconductor package according to an exemplary embodiment of the inventive concepts.

Referring to FIG. 4, a base layer 112, a lower conductive pattern 114, and a connection via 116 may be provided. The base layer 112 may have a flat plate shape. Although not shown, a sacrificial substrate or a carrier may be provided, and the lower conductive pattern 114 may be formed by depositing a conductive material on the sacrificial substrate or the carrier, and patterning the conductive material. Thereafter, a process of laminating the base layer 112, forming a hole vertically extending through the base layer 112, depositing a conductive material in the hole, and patterning the conductive material to form the connection vias 116 and lower conductive patterns 114 may be performed. Although not shown, a seed layer may further be formed before deposition of the conductive material. The process may be repeated, thereby forming a plurality of base layers 112, lower conductive patterns 114 and connection vias 116, which are stacked in the form of a plurality of layers, as shown in FIG. 4. The lower conductive patterns 114 may be buried in the base layers 112 while extending in a horizontal direction. The connection vias 116 may extend in a vertical direction while extending through the base layers 112, and may interconnect the lower conductive patterns 114 which are disposed at different layers.

Used as a material of the base layer 112 may be a thermosetting resin such as an epoxy resin, a thermoplastic resin such as polyimide, or a resin formed by impregnating the thermosetting resin or the thermoplastic resin into a core such as a glass fiber (glass fiber, glass cloth, or glass fabric), etc. together with an inorganic filler, for example, a prepreg, an Ajinomoto build-up film (ABF), bismaleimide triazine (BT), or the like. In addition, a photoimageable dielectric (PID) resin, glass, ceramic, plastic, etc. may also be used as the material of the base layer 112. The lower conductive pattern 114 and the connection via 116 may include or may be formed of copper (Cu), aluminum (Al), tungsten (W), nickel (Ni), titanium (Ti), titanium nitride (TiN), tantalum (Ta), tantalum nitride (TaN), gold (Au), or a combination thereof.

Figure 5:
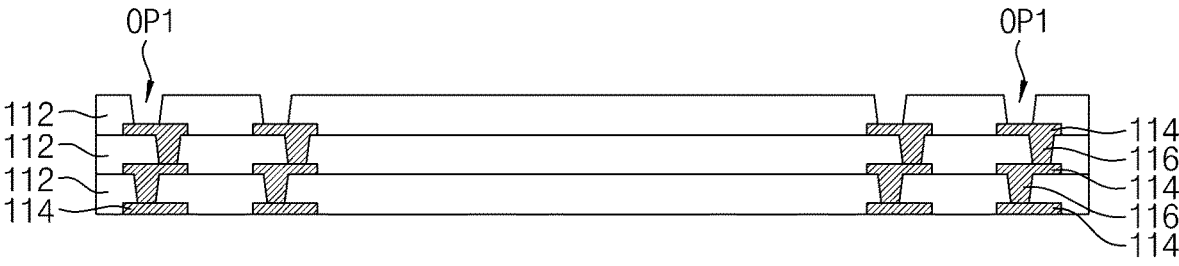

Referring to FIG. 5, an uppermost one of the plurality of base layers 112 may be etched, thereby forming an opening OP1. The opening OP1 may have a circular pillar shape or a frustoconical shape which has a circular cross-section. An uppermost one of the lower conductive patterns 114 may be exposed by the opening OP1.

Figure 6:
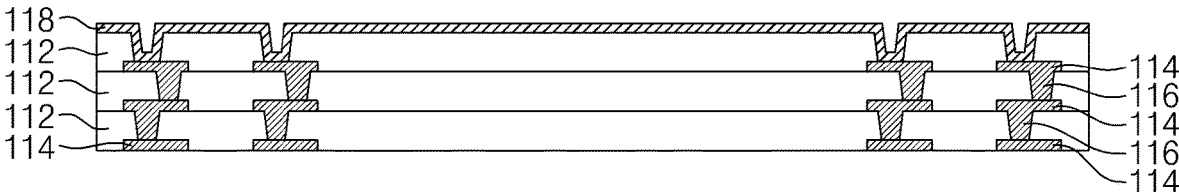

Referring to FIG. 6, the first seed layer 118 may be formed on the resultant structure of FIG. 5. The first seed layer 118 may be conformally formed along an upper surface of the uppermost one of the plurality of base layers 112, inner walls of openings OP1, and an upper surface of the uppermost one of the lower conductive patterns 114. The first seed layer 118 may be formed by a physical vapor deposition (PVD) process, a chemical vapor deposition (CVD) process, an atomic layer deposition (ALD) process, or the like. The first seed layer 118 may include or may be formed of copper (Cu), aluminum (Al), tungsten (W), nickel (Ni), titanium (Ti), titanium nitride (TiN), tantalum (Ta), tantalum nitride (TaN), gold (Au), or a combination thereof. In an embodiment, the first seed layer 118 may include copper (Cu).

Figure 7:
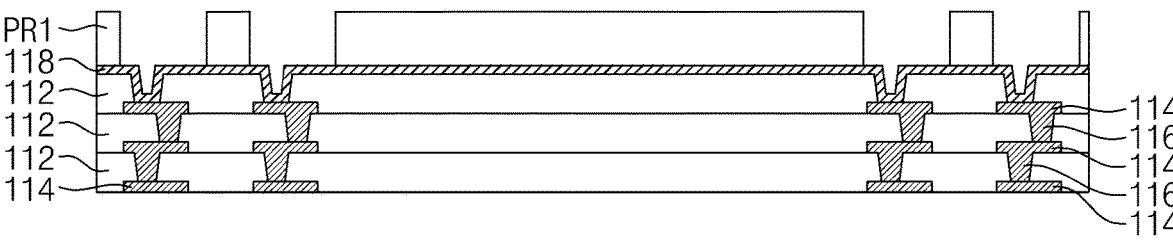

Referring to FIG. 7, a first photoresist PR1 may be formed on the seed layer 118. The first photoresist PR1 formed on the first seed layer 118 may be patterned by an exposure process and, as such, may partially expose the first seed layer 118. For example, a portion of the first seed layer 118 corresponding to the opening OP1 and a region around the opening OP1 may be exposed.

Figure 8:
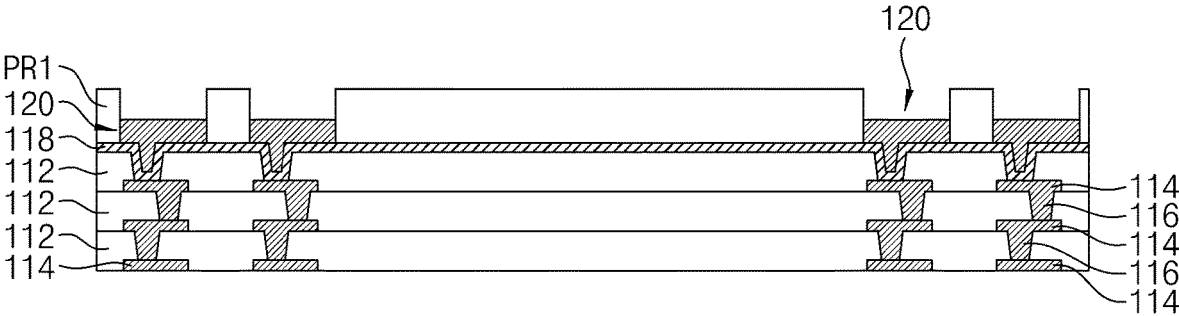

Referring to FIG. 8, first upper conductive patterns 120 may be formed on the seed layer 118. The first upper conductive pattern 120 may be formed by an electrochemical plating process, an electroless plating process, a PVD process, a CVD process, a spin-on process, or a combination thereof. In an embodiment, the first upper conductive pattern 120 may be formed by a plating process using a portion of the first seed layer 118 exposed by the first photoresist PR1 as a seed. For example, the first upper conductive pattern 120 may include copper (Cu) or copper alloy.

Figure 9:
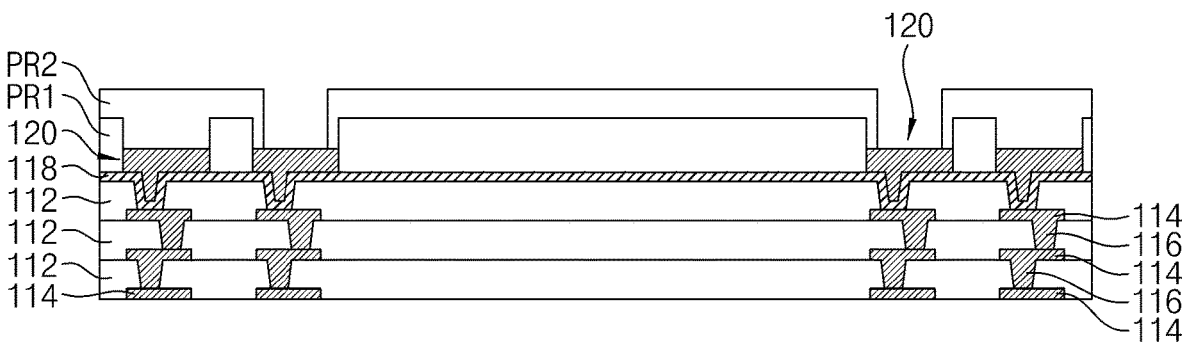

Referring to FIG. 9, a second photoresist PR2 may be formed on the resultant structure of FIG. 8. The second photoresist PR2 may be formed by, for example, an inkjet printing method. The first photoresist PR1 may be covered by the second photoresist PR2, and at least one of the first upper conductive patterns 120 may not be covered by the second photoresist PR2. Although the second photoresist PR2 is shown in FIG. 9 as exposing a portion of an upper surface of the first upper conductive pattern 120, the exemplary embodiments of the disclosure are not limited thereto. In an embodiment, the upper surface of at least one of the first upper conductive patterns 120 may be completely exposed.

Figure 10:
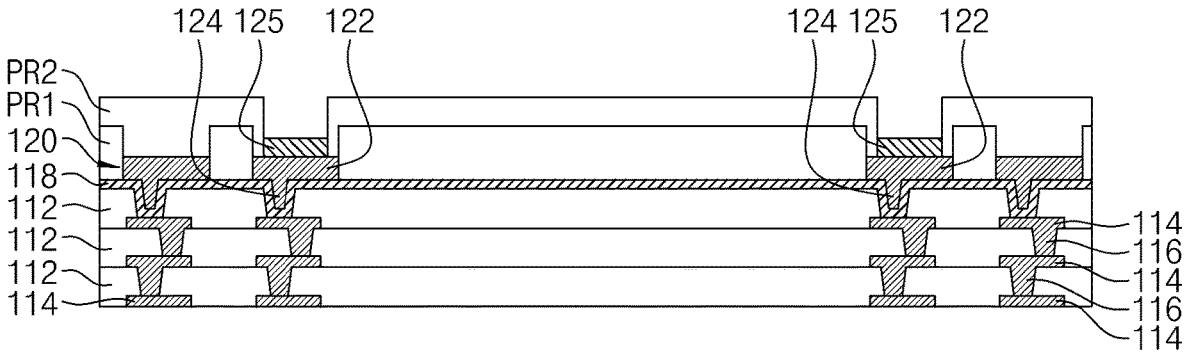

Referring to FIG. 10, second upper conductive patterns 125 may be formed on exposed ones of the first upper conductive patterns 120. As such, the second upper conductive patterns 125 are formed in a different layer of the connection substrate 110 than that of the upper pads 122 of the first upper conductive patterns 120. The second upper conductive pattern 125 may be formed by an electrochemical plating process, an electroless plating process, a PVD process, a CVD process, a spin-on process, or a combination thereof. In an embodiment, the second upper conductive pattern 125 may be formed by a plating process using the first upper conductive pattern 120 exposed by the second photoresist PR2 as a seed. For example, the second upper conductive patterns 125 may include copper (Cu) or copper alloy. From among the first upper conductive patterns 120, the first upper conductive pattern 120 disposed below the second upper conductive pattern 125 while extending in the horizontal direction may be referred to as an upper pad 122. In addition, a portion of the first upper conductive pattern 120 disposed below the upper pad 122 while filling the opening OP1 may be referred to as an upper via 124. The upper via 124 may electrically interconnect the lower conductive pattern 114 and the upper pad 122.

Although the second upper conductive pattern 125 is shown in FIGS. 9 and 10 as being formed without removal of the first photoresist PR1, the exemplary embodiments of the disclosure are not limited thereto. In an embodiment, a photoresist exposing the upper surface of at least one of the first upper conductive patterns 120 may be formed after removal of the first photoresist PR1 following formation of the first upper conductive pattern 120.

Figure 11:
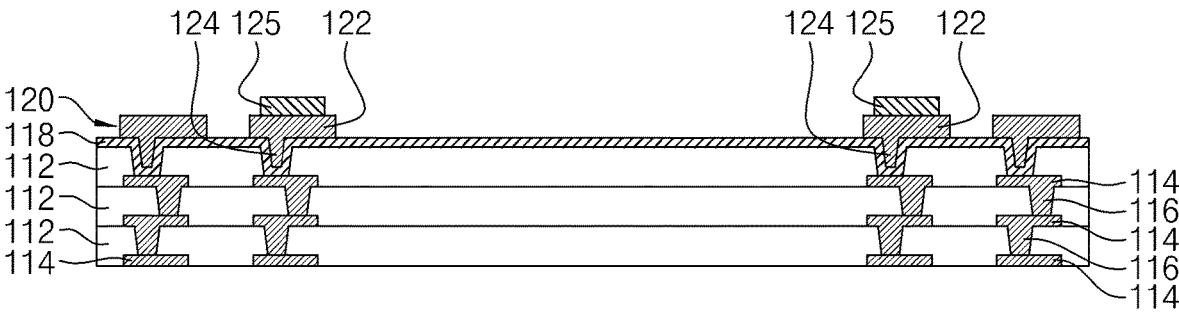

Referring to FIG. 11, the first photoresist PR1 and the second photoresist PR2 may be removed. The first photoresist PR1 and the second photoresist PR2 may be removed by, for example, an ashing process and a stripping process. After removal of the first photoresist PR1 and the second photoresist PR2, side surfaces of the first upper conductive patterns 120 and the second upper conductive patterns 125 and an upper surface of the first seed layer 118 may be exposed.

Figure 12:
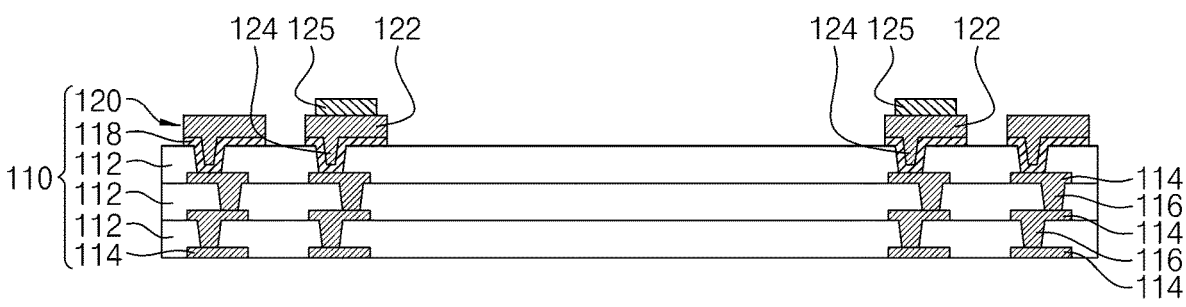

Referring to FIG. 12, a portion of the first seed layer 118 not covered by the first upper conductive pattern 120 may be removed and, as such, an upper surface of the base layer 112 may be exposed. For example, the first seed layer 118 may be etched by an etching process using the first upper conductive pattern 120 and the second upper conductive pattern 125 as an etch mask. After the etching process, the first seed layer 118 may be disposed between the upper pad 122 and the base layer 112 and between the upper via 124 and the base layer 112. After the first seed layer 118 is etched, the base layer 112, the lower conductive pattern 114, the connection via 116, the seed layer 118, the first upper conductive pattern 120, and the second upper conductive pattern 125 may constitute a connection substrate 110.

Figure 13:
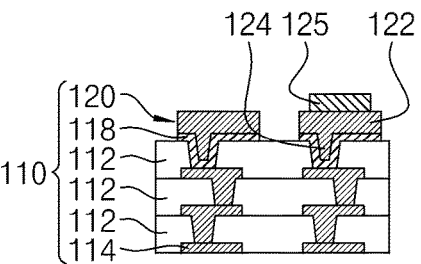

Referring to FIG. 13, a cavity CA may be formed by removing a central portion of the connection substrate 110 by a mechanical drill and/or a laser drill, etc. For example, the connection substrate 110 may have a quadrangular shape or a frame shape including the cavity CA therein. The cavity CA may expose side surfaces of the base layers 112.

Figure 14:
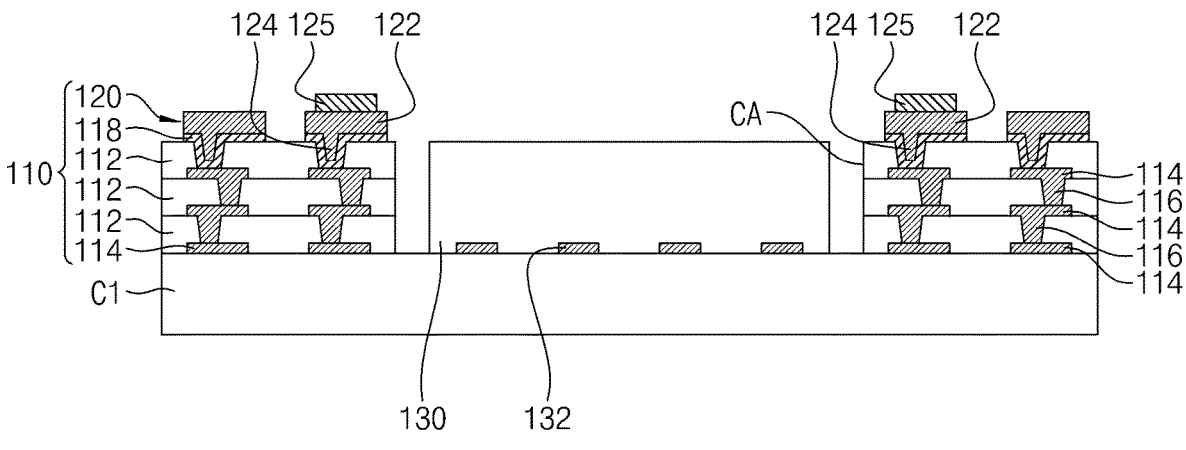

Referring to FIG. 14, a first carrier C1 may be provided. The connection substrate 110 may be attached to the first carrier C1 in plan view. For example, an upper surface of the first carrier C1 may contact a lower surface of the connection substrate 110. The first carrier C1 may be a glass carrier, a ceramic carrier, a silicon wafer, or a conductive substrate including metal. Although not shown, an adhesive layer may further be disposed between the first carrier C1 and the connection plate 110. The adhesive layer may include a polymer-based material. In an embodiment, the adhesive layer may include a light-to-heat-conversion (LTHC) release coating material, and may be thermally released by heat. In another embodiment, the adhesive layer may include an ultraviolet (UV) adhesive releasable by UV light.

A semiconductor chip 130 may be attached to the first carrier C1 in plan view. For example, the semiconductor chip 130 may be disposed in the cavity CA of the connection substrate 110, and may be spaced apart from a side surface of the base layer 112. The semiconductor chip 130 may include chip pads 132 at a lower surface thereof.

Figure 15:
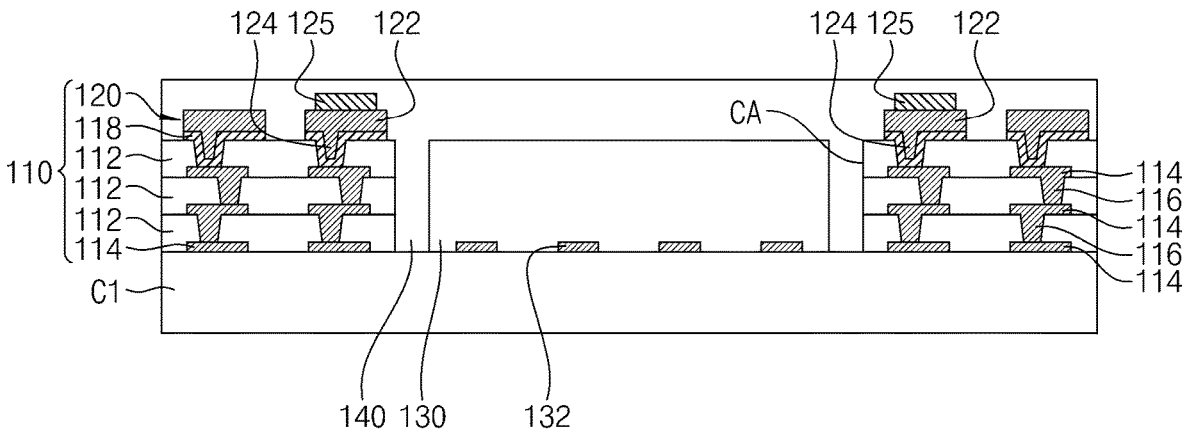

Referring to FIG. 15, an encapsulant 140 may be formed on the resultant structure of FIG. 14. The encapsulant 140 may fill the cavity CA, and may cover the first carrier C1, the semiconductor chip 130 and the connection substrate 110.

The encapsulant 140 may be a resin including epoxy, polyimide or the like. For example, the encapsulant 140 may include or may be formed of a bisphenol-group epoxy resin, a polycyclic aromatic epoxy resin, an o-cresol novolac epoxy resin, a biphenyl-group epoxy resin, a naphthalene-group epoxy resin, or the like.

Figure 16:
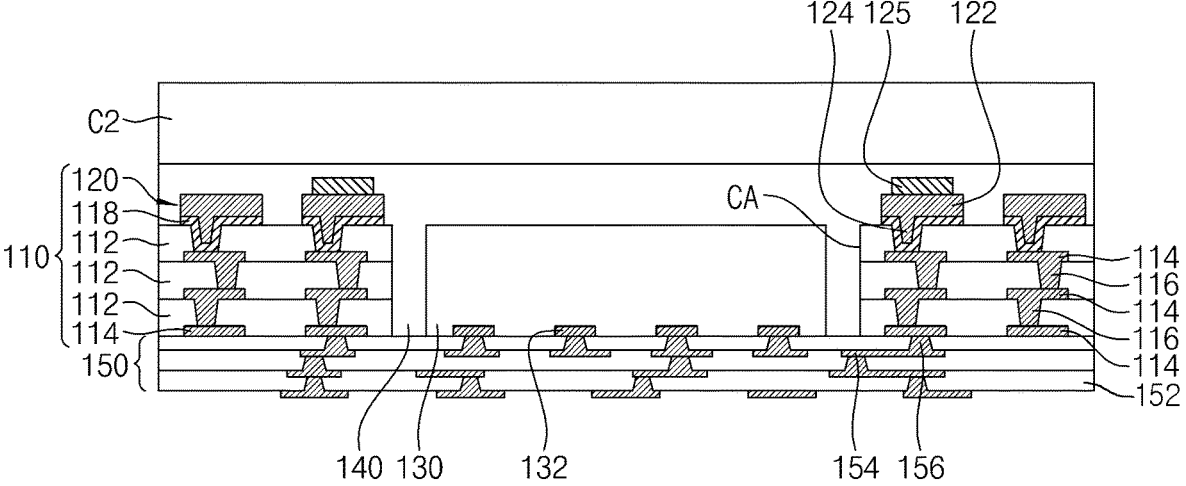

Referring to FIG. 16, the first carrier C1 attached to the lower surface of the connection substrate 110 may be removed, and a second carrier C2 may be attached to an upper surface of the encapsulant 140. Thereafter, a lower redistribution structure 150, which is connected to the connection substrate 110 and the semiconductor chip 130, may be formed. Although the second carrier C2 is shown in FIG. 16 as being disposed over the encapsulant 140, the structure of FIG. 16 may be inverted upon formation of the lower redistribution structure 150 such that the second carrier C2 is disposed below the encapsulant 140.

The lower redistribution structure 150 may include an insulating layer 152, a wiring layer 154, and a via 156. Insulating layers 152 may constitute a plurality of layers, and an uppermost one of the insulating layers 152 may contact the connection substrate 110, the semiconductor chip 130, and the encapsulant 140. Wiring layers 154 may extend in the horizontal direction among the insulating layers 152, and may constitute a plurality of layers. Vias 156 may extend in the vertical direction in order to interconnect the wiring layers 154 which are disposed at different layers. The vias 156 may also connect the first seed layer 118 and the chip pad 132 to corresponding ones of the wiring layers 154, respectively. The wiring layer 154 and the via 156 may be formed by, for example, a dual damascene process. The wiring layer 154 and the via 156 may be formed by forming one insulating layer 152, forming an opening at the insulating layer 152, depositing a conductive material in the opening, and then patterning the conductive material. Through repetition of this process, the lower redistribution structure 150 may be formed.

The insulating layer 152 may include or may be formed of a polymer such as polybenzoxazole (PBO), polyimide, benzocyclobutene (BCB), etc. In another embodiment, the insulating layer 152 may include or may be formed of silicon nitride, silicon oxide, phosphosilicate glass (PSG), borosilicate glass (BSG), boron-doped phosphosilicate glass (BPSG), or a combination thereof. The insulating layer 152 may be formed by a process such as chemical vapor deposition, lamination, spin coating, etc. The wiring layer 154 and the via 156 may include or may be formed of copper (Cu), aluminum (Al), tungsten (W), nickel (Ni), titanium (Ti), titanium nitride (TiN), tantalum (Ta), tantalum nitride (TaN), gold (Au), or a combination thereof.

Figure 17:
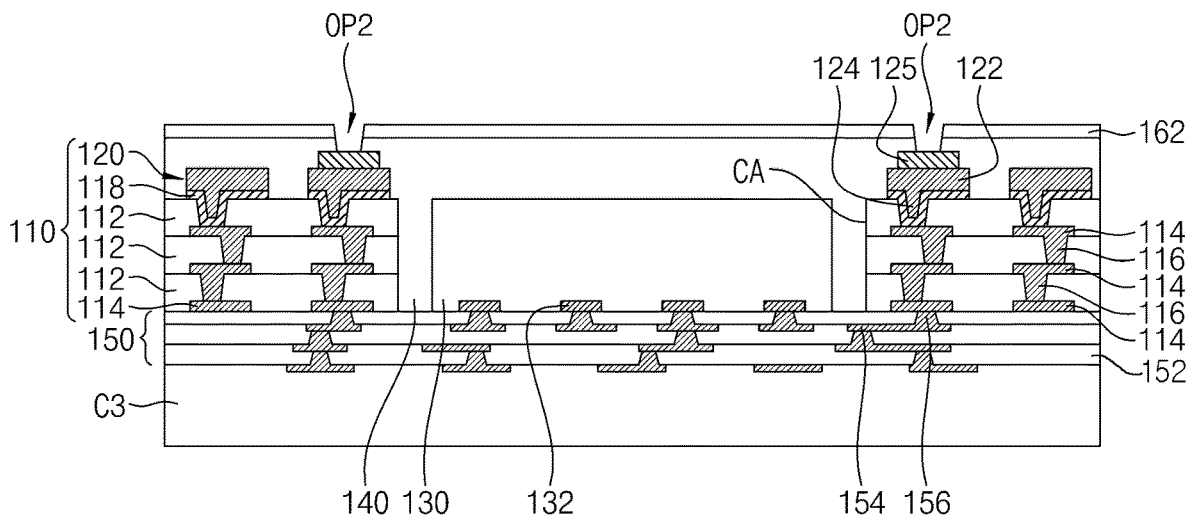

Referring to FIG. 17, the second carrier C2 attached to the upper surface of the encapsulant 140 may be removed, and a third carrier C3 may be attached to a lower surface of the lower redistribution structure 150. Subsequently, an insulating layer 162 may be formed at the upper surface of the encapsulant 140. The insulating layer 162 may include a material identical or similar to that of the insulating layer 152 of the lower redistribution structure 150. The insulating layer 162 may be partially etched, thereby forming openings OP2. The openings OP2 may have a circuit pillar shape or a frustoconical shape which has a circular cross-section. The second upper conductive patterns 125 may be exposed by the openings OP2.

Figure 18:
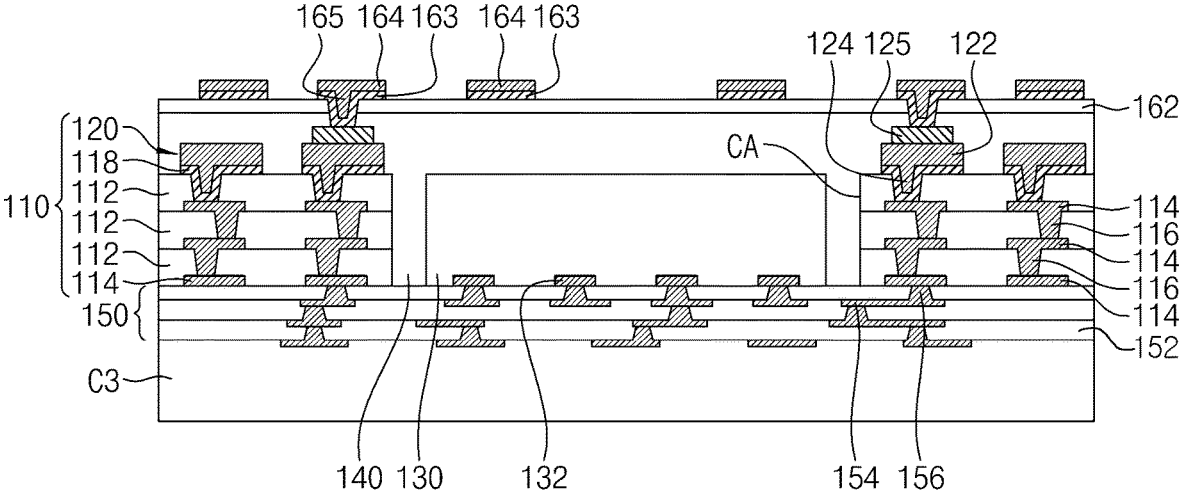

Referring to FIG. 18, a second seed layer 163, a wiring layer 164, and a redistribution via 165 may be formed. The second seed layer 163 may be conformally formed at an upper surface of the resultant structure of FIG. 17. For example, the second seed layer 163 may be formed along an upper surface of the insulating layer 162, a side wall of the opening OP2, and an exposed upper surface of the second upper conductive pattern 125. The second seed layer 163 may be formed by an electrochemical plating process, an electroless plating process, a PVD process, a CVD process, a spin-on process, or a combination thereof. In an embodiment, the second seed layer 163 may be formed by an electroless plating process. For example, the second seed layer 163 may include copper (Cu) or copper alloy. The wiring layer 164 and the redistribution via 165 may be formed on the second seed layer 163. For example, a conductive material may be formed at an upper surface of the second seed layer 163 to fill the opening OP2 by a plating process using the second seed layer 163 as a seed. Thereafter, the conductive material may be patterned, thereby forming the wiring layer 164 and the redistribution via 165. The wiring layer 164 may refer to a portion of the conductive material disposed over the insulating layer 162 while extending in the horizontal direction, and the redistribution via 165 may refer to a portion of the conductive material disposed below the wiring layer 164 while filling the opening OP2. The wiring layer 164 and the redistribution via 165 may include or may be formed of the same materials as the wiring layer 154 and the via 156 of the lower redistribution structure 150, respectively.

Since the second upper conductive pattern 125 is disposed on the first upper conductive pattern 120 prior to formation of the redistribution via 165, as shown in FIGS. 17 and 18, the height of the redistribution via 165 may be reduced. A space filled with a conductive material in formation of the redistribution via 165 may be reduced and, as such, it may be possible to prevent a dimple from being generated at an upper surface of the redistribution via 165 or to prevent a void from being generated within the redistribution via 165.

Figure 19:
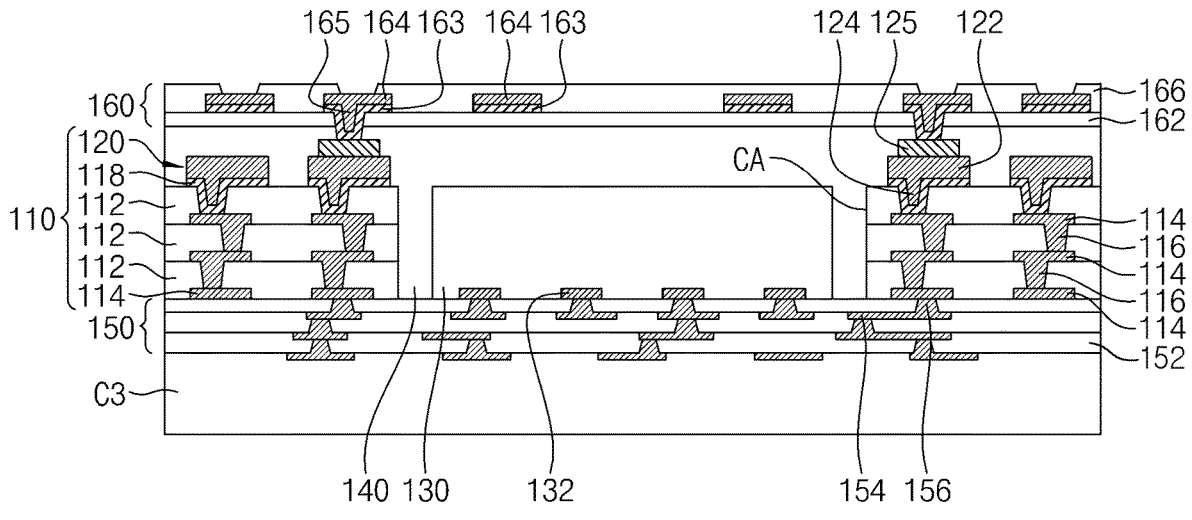

Referring to FIG. 19, a protective layer 166 may be formed on the resultant structure of FIG. 18. The protective layer 166 may cover the insulating layer 162, the second seed layer 163 and the wiring layer 164. In addition, the protective layer 166 may expose a portion of an upper surface of at least one of wiring layers 164. The protective layer 166 may include or may be formed of the same material as the insulating layer 162. The insulating layer 162, the second seed layer 163, the wiring layer 164, the redistribution via 165, and the protective layer 166 may constitute an upper redistribution structure 160.

Again referring to FIG. 1, the third carrier C3 may be removed, and an outer connection terminal 170 may be formed. The outer connection terminal 170 may be disposed at the lower surface of the lower redistribution structure 150, may be electrically connected to the wiring layer 154 and the via 156 corresponding thereto, and may also be electrically connected to a wiring pattern corresponding thereto via the lower redistribution structure 150. The outer connection terminal 170 may include or may be formed of tin (Sn), silver (Ag), copper (Cu), palladium (Pd), bismuth (Bi), or antimony (Sb).

Figure 20:
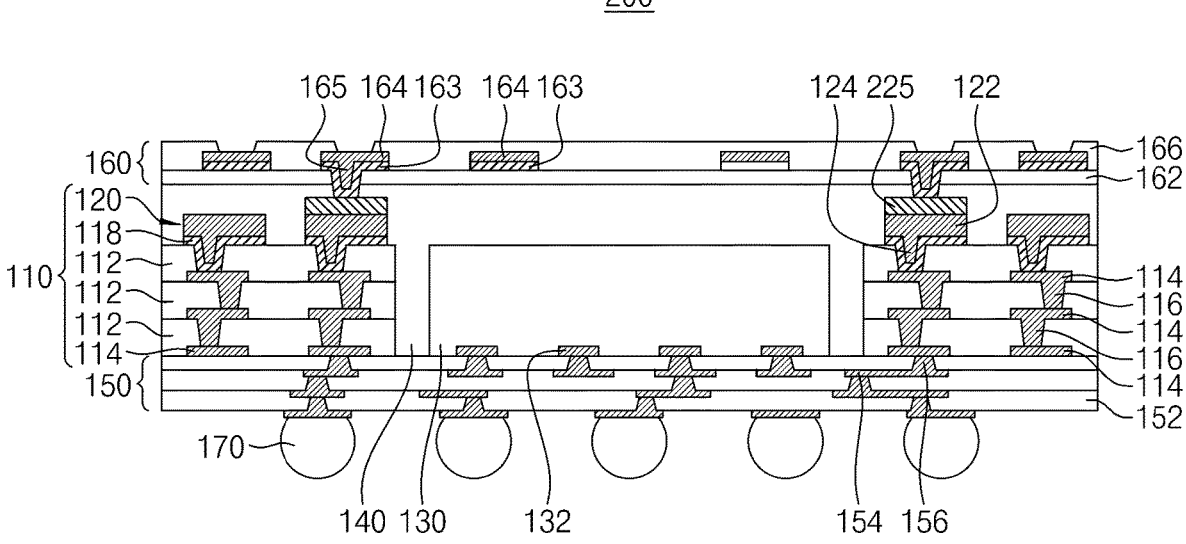
FIG. 20 is a vertical sectional view of a semiconductor package according to an exemplary embodiment of the inventive concepts.
Figure 21:
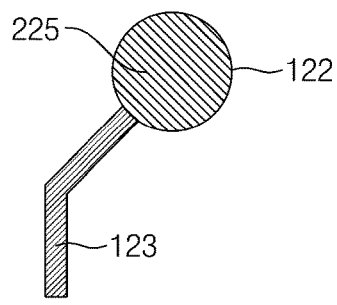
FIG. 21 is a plan view of an upper conductive pattern of the semiconductor package shown in FIG. 20.

FIG. 20 is a vertical sectional view of a semiconductor package according to an exemplary embodiment of the disclosure. FIG. 21 is a plan view of an upper conductive pattern of the semiconductor package shown in FIG. 20.

Referring to FIGS. 20 and 21, a connection substrate 110 of a semiconductor package 200 may include a second upper conductive pattern 225 disposed on an upper pad 122. In an embodiment, the horizontal width of the second upper conductive pattern 225 may be equal to the horizontal width of the upper pad 122. For example, in formation of the second photoresist PR2 described with reference to FIG. 9, the second photoresist PR2 may completely expose the upper pad 122. Thereafter, the second upper conductive pattern 225 may be formed by the plating process described with reference to FIG. 10. As shown in FIG. 21, the second upper conductive pattern 225 may be circular, and may completely overlap with the upper pad 122 in a vertical direction. An upper surface of the upper pad 122 may be completely covered by the second upper conductive pattern 225, and may not contact the encapsulant 140.

Figure 22:
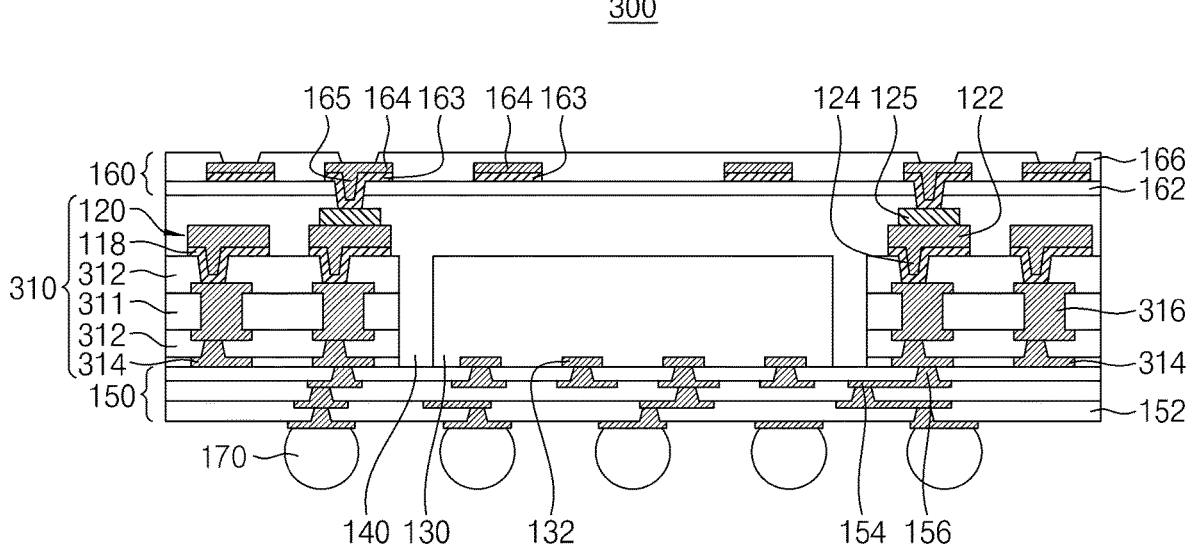
FIGS. 22 to 24 are vertical sectional views of semiconductor packages according to exemplary embodiments of the inventive concepts.
Figure 23:
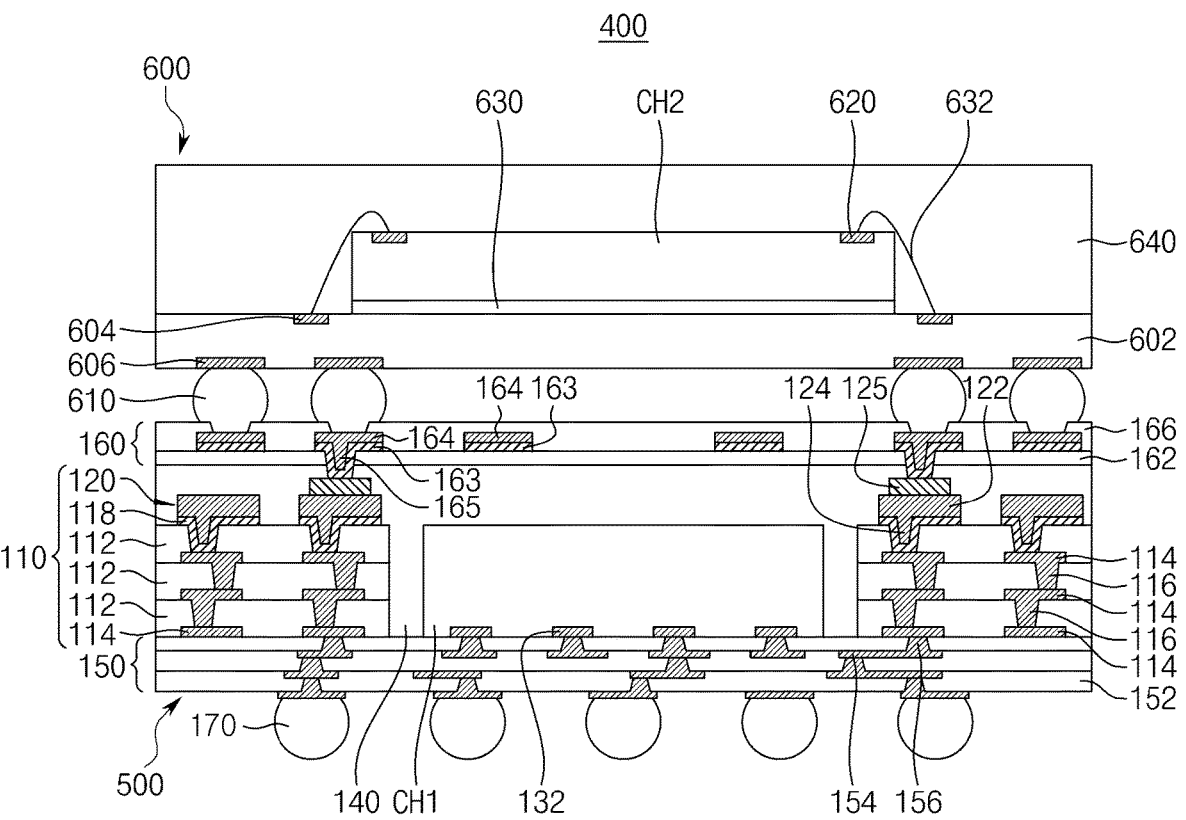
Figure 24:
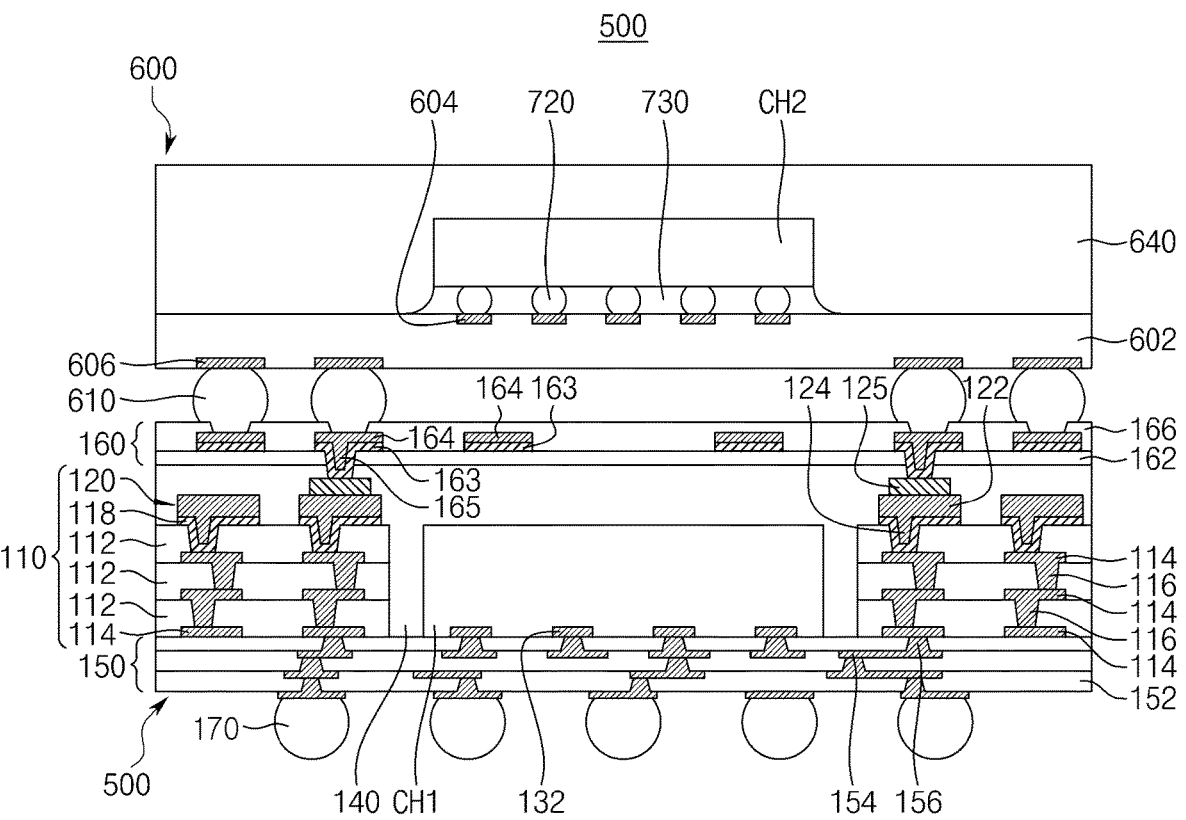

FIGS. 22 to 24 are vertical sectional views of semiconductor packages according to exemplary embodiments of the inventive concepts.

Referring to FIG. 22, a semiconductor package 300 may include a connection substrate 310 on a lower redistribution structure 150. The connection substrate 310 may include a core layer 311, an insulating layer 312, a wiring layer 314, and a through via 316. The core layer 311 may be disposed at a vertical-level central portion of the connection substrate 310, and insulating layers 312 may be disposed at top and lower surfaces of the core layer 311. The wiring layer 314 may be disposed at a lower surface of the insulating layer 312 disposed below the core layer 311. The through via 316 may extend in a vertical direction while extending through the core layer 311. The connection substrate 310 may further include a first seed layer 118, a first upper conductive pattern 120, an upper via 124, and a second upper conductive pattern 125. As described with reference to FIG. 1, the first seed layer 118 may cover a lower surface of the first upper conductive pattern 120 and a lower surface and side surfaces of the upper via 124. An upper surface of the through via 316 may contact the first seed layer 118, and the through via 316 may be electrically connected to the first upper conductive pattern 120 via the upper via 124. The core layer 311 and the insulating layer 312 may include or may be formed of an insulating material such as resin, epoxy, etc., and the through via 316 may include or may be formed of a conductive material such as copper (Cu).

Referring to FIG. 23, a semiconductor package 400 may have a package-on-package structure. For example, the semiconductor package 400 may include a lower package 500, and an upper package 600 on the lower package 500. The lower package 500 may have a structure identical or similar to that of the semiconductor package 100. The lower package 500 may have characteristics of the semiconductor package 100 described with reference to FIGS. 1 to 3 and, as such, no detailed description thereof will be given.

The upper semiconductor package 600 may include a substrate 602, a package connection terminal 610, a semiconductor chip CH2, an adhesive member 630, a bonding wire 632, and an encapsulant 640. The substrate 602 may include upper pads 604 and lower pads 606. In an embodiment, the substrate 602 may be a printed circuit board, and may include an insulating material such as a phenolic resin, an epoxy resin, a prepreg, etc. In another embodiment, the substrate 602 may be a redistribution layer in which an insulating material and a conductive material are stacked. The upper pads 604 and the lower pads 606 may be formed by forming a metal layer at a base of the substrate 602, and then patterning the metal layer. Although not shown, a solder resist layer may be disposed at top and lower surfaces of the substrate 602, and may partially cover the upper pads 604 and the lower pads 606.

The upper pads 604 may be disposed at the upper surface of the substrate 602, and may be electrically connected to the semiconductor chip CH2. The lower pads 606 may be disposed at the lower surface of the substrate 602, and at least one of the lower pads 606 may be electrically connected to the upper pad 604 corresponding thereto. The package connection terminal 610 may contact the lower pad 606 and a wiring layer 164 of an upper redistribution structure 160. The package connection terminal 610 may electrically interconnect the upper package 600 and the lower package 500.

The lower pad 606 and the upper pad 604 may include or may be formed of a metal such as aluminum (Al), titanium (Ti), chrome (Cr), iron (Fe), cobalt (Co), nickel (Ni), copper (Cu), zinc (Zn), lead (Pd), platinum (Pt), gold (Au), and silver (Ag). The package connection terminal 610 may be a solder bump.

The semiconductor chip CH2 may be mounted on the substrate 602. A semiconductor chip CH1 of the lower package 500 and the semiconductor chip CH2 of the upper package 600 may be semiconductor devices of different kinds, respectively. For example, the semiconductor chip CH1 may include an application processor chip such as a microprocessor, a microcontroller, etc. or a logic chip such as a CPU, a GPU, a modem, an ASIC, an FPGA, etc. The semiconductor chip CH2 may include a volatile memory chip such as DRAM or a non-volatile memory chip such as flash memory. The semiconductor chip CH2 may be mounted on the substrate 602 via wire bonding. For example, the semiconductor chip CH2 may include chip pads 620 at an upper surface thereof, and the chip pads 620 may be electrically connected to the upper pads 604 by bonding wires 632. The semiconductor chip CH2 may be electrically connected to a lower redistribution structure 150. For example, the semiconductor chip CH2 may be electrically connected to the lower redistribution structure 150 via a connection substrate 110, the upper redistribution structure 160, the package connection terminal 610 and the substrate 602.

The adhesive member 630 may be disposed between the substrate 602 and the semiconductor chip CH2, and may fix the semiconductor chip CH2 to the upper surface of the substrate 602. The adhesive member 630 may be a die attach film, without being limited thereto. The encapsulant 640 may cover the substrate 602, the semiconductor chip CH2, and the bonding wire 632. The encapsulant 640 may include an epoxy resin.

Referring to FIG. 24, a semiconductor package 400 may include a lower package 500, and an upper package 600 on the lower package 500. The upper package 600 may include a semiconductor chip CH2, a bump 720, and an underfill 730. In an embodiment, the semiconductor chip CH2 may be mounted on a substrate 602 via flip chip bonding. Bumps 720 may be disposed at a lower surface of the semiconductor chip CH2, and may contact upper pads 604. The underfill 730 may be disposed between the substrate 602 and the semiconductor chip CH2, and may cover the bumps 720. The underfill 730 may include or may be formed of a non-conductive paste (NCP), a non-conductive film (NCF), a capillary underfill (CUF), or other insulating materials.

In accordance with the exemplary embodiments of the inventive concepts, a second upper conductive pattern may be disposed on a first upper conductive pattern of a connection substrate electrically connected to an upper redistribution structure. Accordingly, the height of a redistribution via may be reduced by the thickness of the second upper conductive pattern and, as such, it may be possible to realize a redistribution via using a smaller pattern and to realize miniaturization of a semiconductor device.

While the embodiments of the inventive concepts have been described with reference to the accompanying drawings, it should be understood by those skilled in the art that various modifications may be made without departing from the scope of the inventive concepts and without changing essential features thereof. Therefore, the above-described embodiments should be considered in a descriptive sense only and not for purposes of limitation.

What is claimed is:

1. A semiconductor package comprising:
   a lower redistribution structure including a wiring layer, and vias connected to the wiring layer;
   a connection substrate on the lower redistribution structure, the connection substrate including a base layer, lower conductive patterns in the base layer, a first set of first upper conductive patterns disposed on the base layer, a second set of first upper conductive patterns disposed on the base layer, each of the first set of first upper conductive patterns including an upper pad, and second upper conductive patterns disposed on and in contact with the upper pads of the first set of first upper conductive patterns;
   a semiconductor chip disposed on the lower redistribution structure and disposed in a cavity of the connection substrate;
   an encapsulant covering the lower redistribution structure, the connection substrate and the semiconductor chip; and
   an upper redistribution structure on the encapsulant,
   wherein the upper redistribution structure includes a plurality of redistribution vias, each of the plurality of redistribution vias extend below an upper surface of the encapsulant and connect to an upper surface of the second upper conductive patterns,
   wherein the upper surface of the second upper conductive patterns and the upper pads are disposed below the upper surface of the encapsulant,
   wherein each of the second set of first upper conductive patterns includes an upper wiring having a smaller horizontal width than the upper pads of the first set of first upper conductive patterns,
   wherein the entirety of a top surface of the upper wirings of the second set of first upper conductive patterns are in contact with the encapsulant, and
   wherein a bottom surface of the upper pads is disposed above a top surface of the base layer.

2. The semiconductor package according to claim 1, wherein:
   with respect to a top down view, the outer boundary of the second upper conductive patterns do not extend outside the outer boundary of the upper pads; and
   only a part of an upper surface of the upper pads contact the encapsulant.

3. The semiconductor package according to claim 1, wherein:

the connection substrate further includes upper vias; and the upper vias are disposed below and in contact with the upper pads, vertically extend through the base layer, and are electrically connected to the lower conductive patterns.

4. The semiconductor package according to claim 3, wherein the connection substrate further includes a seed layer covering a lower surface of the upper pads and a lower surface and side surfaces of the upper vias.

5. The semiconductor package according to claim 4, wherein the seed layer contacts at least one of the lower conductive patterns.

6. The semiconductor package according to claim 1, wherein a height of each of the second upper conductive patterns is 15 to 20 μm.

7. The semiconductor package according to claim 2, wherein no side surface of the second upper conductive patterns are in contact with a wiring or any other conductive material.

8. The semiconductor package according to claim 1, wherein:

the upper redistribution structure further includes an insulating layer covering the upper surface of the encapsulant, and wiring layers on the insulating layer; and at least one of the wiring layers is connected to the plurality of redistribution vias.

9. The semiconductor package according to claim 8, wherein a height between an upper surface of the insulating layer and the upper surface of the second upper conductive patterns is 25 to 35 μm.

10. The semiconductor package according to claim 9, wherein the upper redistribution structure further includes a seed layer covering a lower surface of the wiring layers and a lower surface and side surfaces of the redistribution vias, and wherein the seed layer is disposed between and in contact with the lower surface of the redistribution vias and the upper surface of the second upper conductive patterns.

11. The semiconductor package according to claim 1, wherein a horizontal width of the second upper conductive patterns is equal to a horizontal width of the upper pads.

12. The semiconductor package according to claim 1, wherein the lower redistribution structure is electrically connected to the semiconductor chip and the connection substrate.

13. A semiconductor package comprising:

a lower package; and an upper package on the lower package, wherein the lower package includes a lower redistribution structure including a wiring layer, and vias connected to the wiring layer, a connection substrate on the lower redistribution structure, the connection substrate including a base layer, lower conductive patterns in the base layer, a first set of first upper conductive patterns disposed on the base layer, a second set of first upper conductive patterns disposed on the base layer, each of the first set of first upper conductive patterns including an upper pad, and second upper conductive patterns disposed on and in contact with the upper pads of the first set of first upper conductive patterns, a first semiconductor chip disposed on the lower redistribution structure and disposed in a cavity of the connection substrate, an encapsulant covering the lower redistribution structure, the connection substrate and the first semiconductor chip, and an upper redistribution structure on the encapsulant, wherein the upper redistribution structure includes a plurality of redistribution vias, each of the plurality of redistribution vias extend below an upper surface of the encapsulant and connect to an upper surface of the second upper conductive patterns, wherein the upper surface of the second upper conductive patterns and the upper pads are disposed below the upper surface of the encapsulant, wherein each of the second set of first upper conductive patterns includes an upper wiring having a smaller horizontal width than the upper pads of the first set of first upper conductive patterns, wherein the entirety of a top surface of the upper wirings of the second set of first upper conductive patterns are in contact with the encapsulant, and wherein a bottom surface of the upper pads is disposed above a top surface of the base layer.

14. The semiconductor package according to claim 13, wherein:

the upper package includes a substrate, a package connection terminal disposed below the substrate and connected to the upper redistribution structure, and a second semiconductor chip on the substrate; and the second semiconductor chip is electrically connected to the lower redistribution structure via the substrate, the package connection terminal, the upper redistribution structure and the connection substrate.

15. The semiconductor package according to claim 14, wherein the first semiconductor chip is a logic chip, and the second semiconductor chip is a memory chip.

16. A semiconductor package comprising:

a lower redistribution structure including a wiring layer, and a vias connected to the wiring layer;

an outer connection terminal below the lower redistribution structure;

a connection substrate on the lower redistribution structure, the connection substrate including base layers, lower conductive patterns in the base layers, a first set of first upper conductive patterns disposed on an uppermost one of the base layers, a second set of first upper conductive patterns disposed on the uppermost one of the base layers, each of the first set of first upper conductive patterns and the second set of first upper conductive patterns including an upper pad, and second upper conductive patterns disposed only on and in contact with the upper pads of the first set of first upper conductive patterns;

a semiconductor chip disposed on the lower redistribution structure and disposed In a cavity of the connection substrate;

an encapsulant covering the lower redistribution structure, the connection substrate and the semiconductor chip; and an upper redistribution structure on the encapsulant, wherein the upper redistribution structure includes an insulating layer covering an upper surface of the encapsulant, a wiring layer on the insulating layer, and a plurality of redistribution vias interconnecting the wiring layer and the second upper conductive patterns, wherein each of the redistribution vias extend below an upper surface of the encapsulant and connect to an upper surface of the second upper conductive patterns, wherein the upper surface of the second upper conductive patterns and the upper pads are disposed below the upper surface of the encapsulant, wherein each of the second set of first upper conductive patterns includes an upper wiring having a smaller horizontal width than the upper pads of the first set of first upper conductive patterns, wherein the entirety of a top surface of the upper wirings of the second set of first upper conductive patterns are in contact with the encapsulant, and wherein a bottom surface of the upper pad is disposed above a top surface of the base layer.

17. The semiconductor package according to claim 16, wherein the connection substrate further includes connection vias interconnecting the lower conductive patterns of different layers.

\* \* \* \* \*